(12) United States Patent
Lee

(10) Patent No.: US 6,225,183 B1
(45) Date of Patent: May 1, 2001

(54) METHOD OF FABRICATING A THIN-FILM RESISTOR HAVING STABLE RESISTANCE

(75) Inventor: Jia-Sheng Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/330,030

(22) Filed: Jun. 11, 1999

(51) Int. Cl.$^7$ .................................................. H01L 21/20
(52) U.S. Cl. ............................................ 438/384; 438/384
(58) Field of Search .................................... 438/424, 524, 438/382, 384, 152, 153, 154

(56) References Cited

U.S. PATENT DOCUMENTS

| | | | | |
|---|---|---|---|---|
| 3,649,945 | * | 3/1972 | Waits ..................................... | 338/309 |
| 5,525,831 | * | 6/1996 | Ohkawa et al. ...................... | 257/543 |
| 6,069,398 | * | 5/2000 | Kadosh et al. ....................... | 257/538 |
| 6,081,014 | * | 6/2000 | Redford et al. ...................... | 257/359 |

* cited by examiner

*Primary Examiner*—David Nelms
*Assistant Examiner*—David Nhu

(74) *Attorney, Agent, or Firm*—Winston Hsu

(57) ABSTRACT

The present invention provides a method of forming a thin-film resistor with a stable electric resistance on a dielectric layer of a semiconductor wafer. The method involves: 1. forming a resistance layer and a protective layer in a predetermined area of the dielectric layer, the protective layer being positioned on the resistance layer, 2. forming an insulating layer on the upper and side surfaces of the protective layer and the side surface of the resistance layer in the predetermined area, and on the surface of the dielectric layer outside the predetermined area, 3. performing a dry-etching process on the insulating layer within the predetermined area to form two openings extending down to the protective layer, the protective layer being used for preventing the resistance layer from plasma damage caused by the dry-etching process, 4. performing a wet-etching process on the protective layer through the two openings of the insulating layer to form two openings extending down to the resistance layer, 5. forming two plugs in the two openings of the insulating layer and the protective layer for electrically connecting two ends of the resistance layer, and 6. forming two conductive layers on the two plugs as two electric wires for electrically connecting the two ends of the resistance layer.

8 Claims, 4 Drawing Sheets

METHOD OF FABRICATING A THIN-FILM RESISTOR HAVING STABLE RESISTANCE

BACKGROUND OF THE INVENTION

1. Field of the Invention

The present invention relates to a thin-film resistor, and more particularly, to a thin-film resistor employed in a semiconductor wafer and its method of formation.

2. Description of the Prior Art

There are many kinds of resistor components in ICs of a semiconductor wafer such as the gate conducting layer of the semiconductor wafer, impurity doped layer as a resistance component, or the thin-film resistor. The main problem with the gate conducting layer and the impurity doped layer is that the resistance of both are too low. Therefore, these components, if used, must be made large to increase their resistance to sufficient levels. It is clear that the gate conducting layer and the impurity doped layer are not suitable for use in semiconductor processing with small line-widths. Also, since the gate conducting layer and the impurity doped layer comprise silicon conducting material, the conductivity of the resistance component easily varies with temperature changes making the resistance of these resistance components very unstable. If a layer of resistance component with low conductivity and stable resistance is required for an IC, the thin-film resistor is essential.

Please refer to FIG. 1 and FIG. 2. FIG. 1 and FIG. 2 are schematic diagrams of the method of forming a thin-film resistor 18 according to the prior art. A thin-film resistor 18 of the prior art is formed on the surface of the dielectric layer 10 of a semiconductor wafer 11. First, a resistance layer 12 and a protective layer 14 are sequentially formed within a predetermined area on the surface of the dielectric layer 10. Next, a conducting layer 16 made of alloy of aluminum is formed on the surface of the dielectric layer 10 and the protective layer 14, as shown in FIG. 1. Then, a wet etching process is performed to remove all of the conducting layer 16 and the protective layer 14 on the resistance layer 12 except for at the two ends of the resistance layer 12. This remaining portion is used as the electrical connecting wires of the two ends of the resistance layer 12. FIG. 2 illustrates the completed thin-film resistor 18.

The wet-etching process is an isotropic process, that is to say the side depth of etching is approximately equal to the vertical depth of etching. Since the thin-film resistor 18 patterns the conducting layer 16 by wet-etching, it is essential that the resistance layer 12 and the protective layer 14 have large surface areas so that the most of the conducting layer 16 and the protective layer 14 on the surface of the resistance layer 12 can be removed. At the same time, the conducting layer 16 and the protective layer 14 at the two ends of the resistance layer 12 are maintained. So the prior art method of forming the thin-film resistor 18 can only be used in processes with line-width of 3 μm and cannot be used in processes with smaller line widths.

SUMMARY OF THE INVENTION

It is therefore a primary objective of the present invention to provide a thin-film resistor employed in a semiconductor wafer and method of forming the same to solve the above mentioned problem.

In a preferred embodiment, the present invention provides a method of forming a thin-film resistor on a dielectric layer of a semiconductor wafer comprising:

forming a resistance layer and a protective layer in a predetermined area of the dielectric layer, the protective layer being positioned on the resistance layer;

forming an insulating layer on the upper and side surfaces of the protective layer and the side surface of the resistance layer in the predetermined area, and on the surface of the dielectric layer outside the predetermined area;

performing a dry-etching process on the insulating layer within the predetermined area to form two openings extending down to the protective layer, the protective layer being used for preventing the resistance layer from plasma damage caused by the dry-etching process;

performing a wet-etching process on the protective layer through the two openings of the insulating layer to form two openings extending down to the resistance layer;

forming two plugs in the two openings of the insulating layer and the protective layer for electrically connecting two ends of the resistance layer; and forming two conductive layers on the two plugs as two electric wires for electrically connecting the two ends of the resistance layer.

It is an advantage of the present invention that the thin-film resistor of the present invention has stable resistance and can be used in the processes with smaller line-widths to reduce the area of the semiconductor products.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
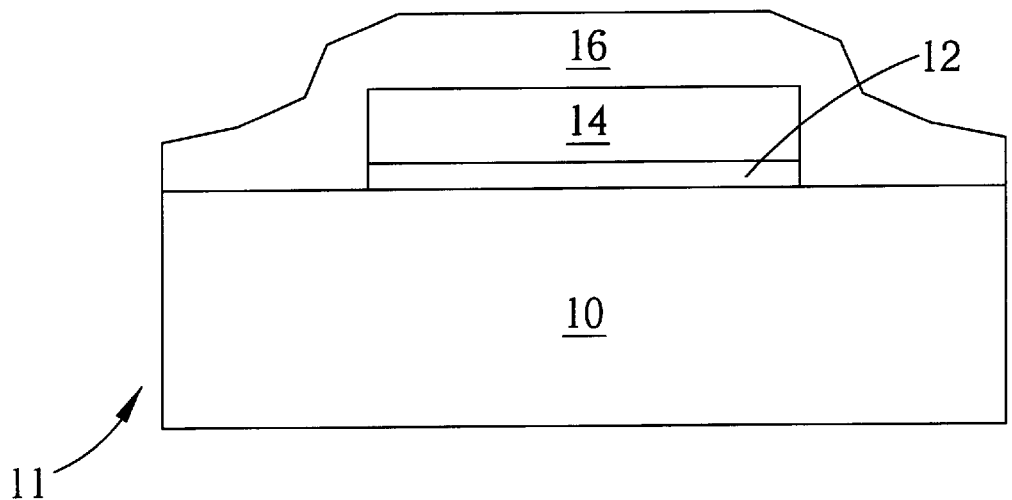
FIG. 1 and FIG. 2 are schematic diagrams of the method of forming a thin-film resistor according to the prior art.
Figure 2:
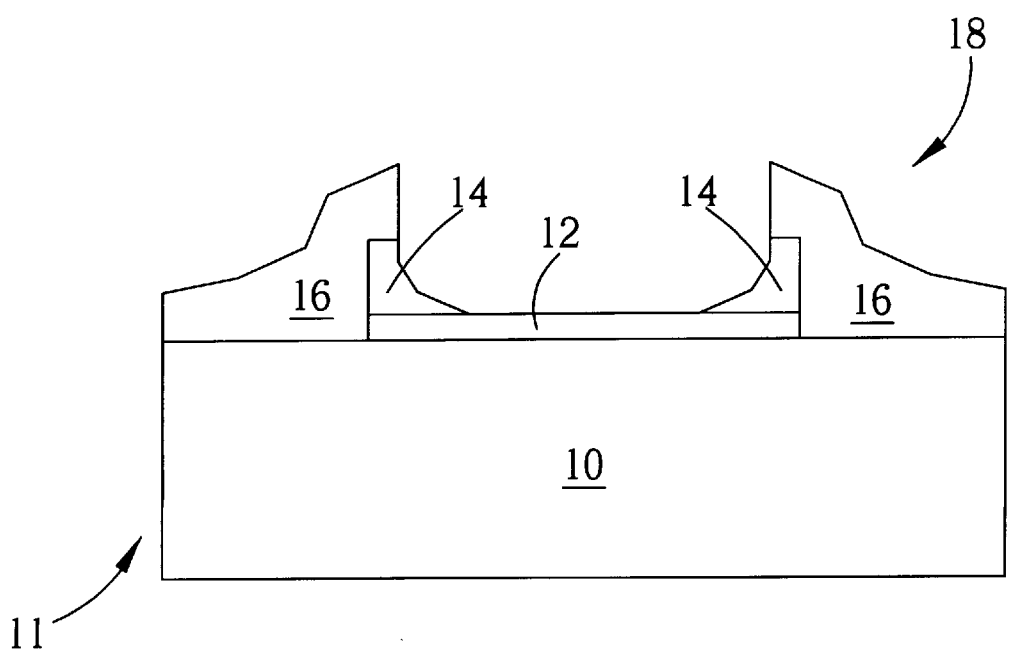
Figure 3:
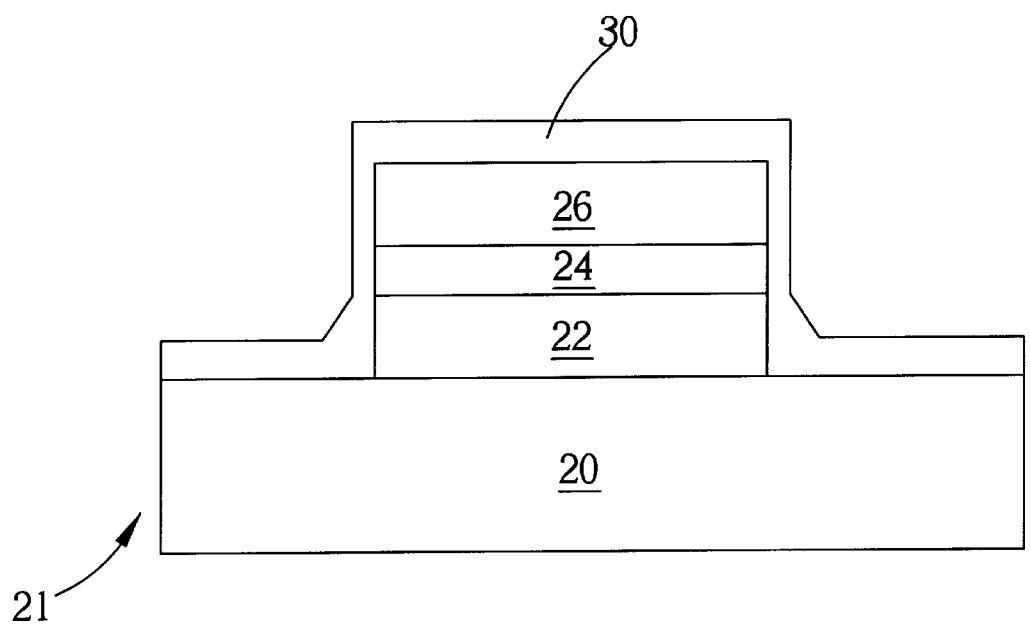
FIG. 3 to FIG. 7 are schematic diagrams of the method of forming a thin-film resistor according to the present invention.

Please refer to FIG. 3 to FIG. 7. FIG. 3 to FIG. 7 are schematic diagrams of the method of forming a thin-film resistor 40 according to the present invention. The thin-film resistor 40 of the present invention is formed on a dielectric layer 20 of a semiconductor wafer 21, and the dielectric layer 20 is formed of borophosphosilicate glass (BPSG). During the formation of the thin-film resistor 40, an isolating layer 22 formed of silicon nitride (SiN) or silicon oxide and a resistance layer 24 formed of CrSi are first sequentially deposited on the surface of the dielectric layer 20. Then, a chemical vapor deposition process is performed to form a protective layer 26 made of silicon nitride on the resistance layer 24. Then, a lithographic process and an anisotropic dry-etching process to form an isolating layer 22, a resistance layer 24, and a protective layer 26 within a predetermined area on the surface of the dielectric layer 20 is performed. Then, an insulating layer 30 which is made of silicon oxide is formed on the surface of the semiconductor wafer 21 by chemical vapor deposition to cover the upper and side surfaces of the protective layer 26 and the side surface of the resistance layer 24 in the predetermined area as well as the surface of the dielectric layer 20 outside the predetermined area, as shown in FIG. 3.

Figure 4:
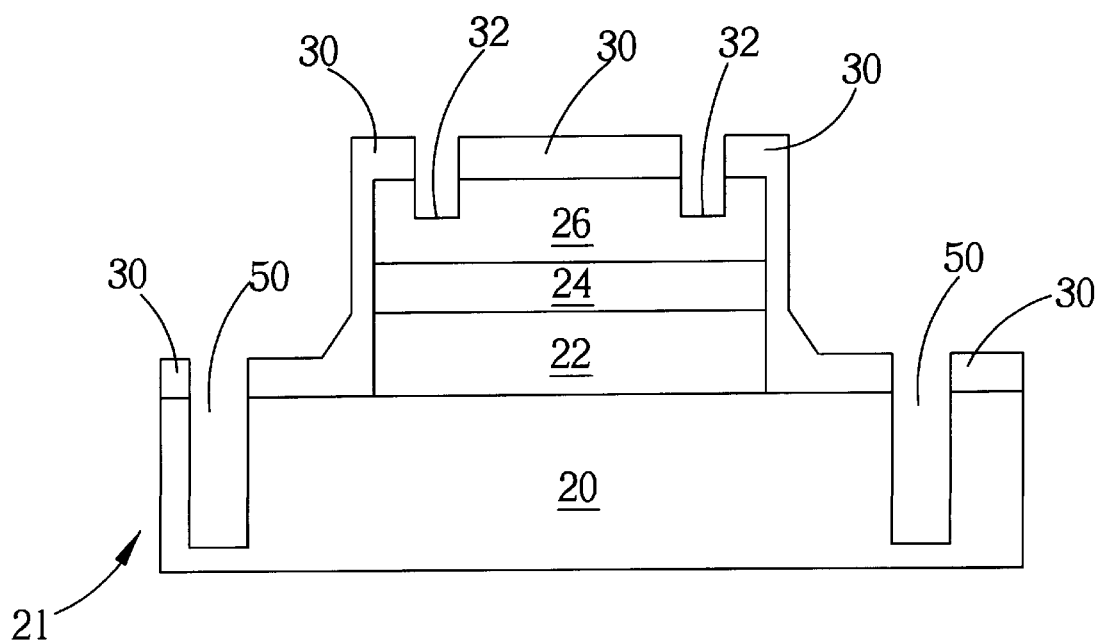
Figure 5:
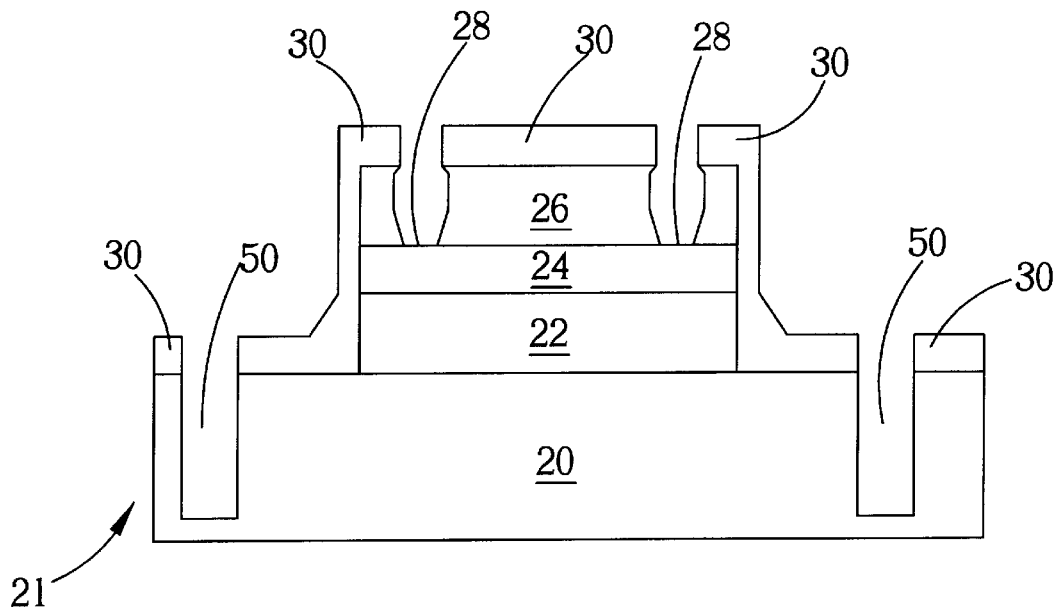

Next, another lithographic process and a dry-etching process is performed on the insulating layer 30 within the predetermined area to form two openings 32 extending down to the protective layer 26. At the same time, two contact holes 50 are formed on the insulating layer 30 and the dielectric layer 20 outside the predetermined area and are used as a path for electrically connecting to the components of the semiconductor wafer 21, as shown in FIG. 4. Then, a wet-etching process with phosphoric acid ($H_3PO_4$) is performed on the protective layer 26 through the two openings 32 of the insulating layer 30 to form two openings 28 extending down to the resistance layer 24, as shown in FIG. 5.

Figure 6:
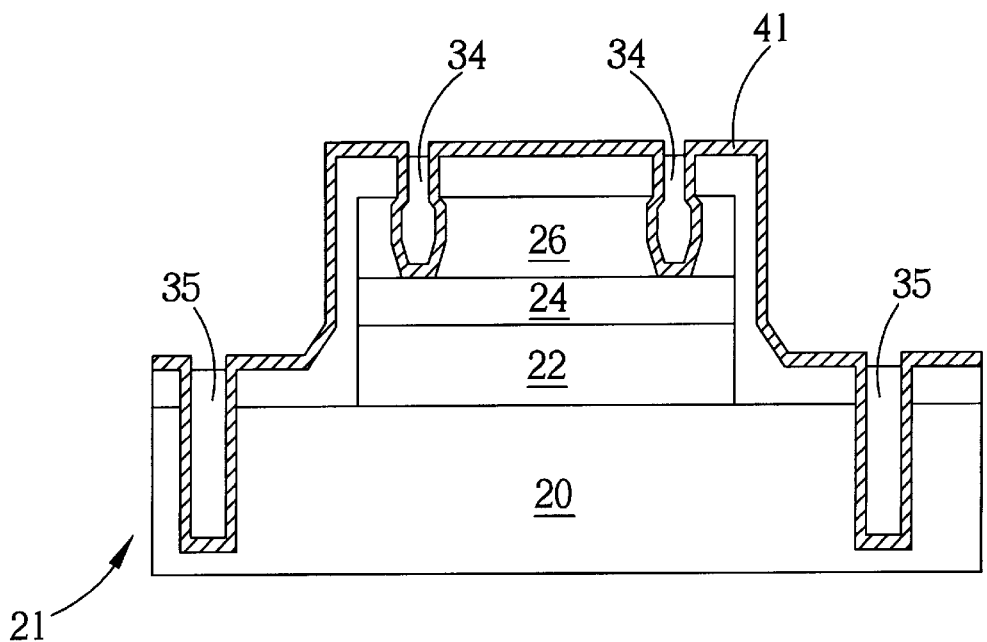

Next, an adhesive layer 41 and a tungsten layer 34 are sequentially formed on the surface of the semiconductor wafer 21, the surface of the two openings 28 inside the insulating layer 30 and the protective layer 26, and the surface of the contact holes 50. The adhesive layer 41 comprises a titanium layer, and a titanium nitride layer above the titanium layer used as a stumbling layer for isolating the tungsten layer 34 and the titanium layer. The tungsten layer 34 inside the openings 28 become plugs 34, the tungsten layer 34 inside the contact holes 50 become plugs 35. Then, an etch back process is performed on the surface of the semiconductor wafer 21 to remove the tungsten layer 34 from the insulating layer 30 so that the top end of each of the plugs 34, 35 is at approximately the same height as the surface of the insulating layer 30, as shown in FIG. 6.

Figure 7:
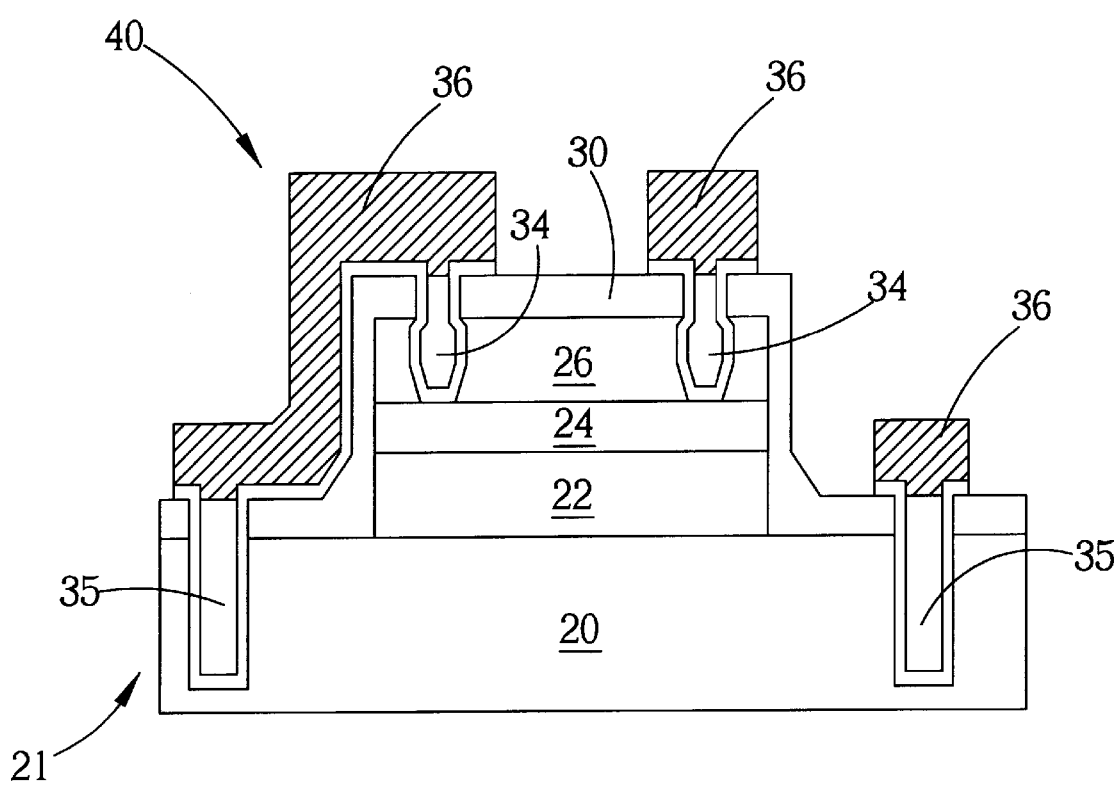

Finally, a conducting layer 36 made of an alloy consisting mostly of aluminum is deposited on the surface of the semiconductor wafer 21. A lithographic process and a metallic etch process is then performed to remove all the conducting layer 36 and the adhesive layer 41 from above the plugs 34 outside the predetermined area so as to form a plurality of conducting layers 36 on the surface of each plugs 34, 35. This completes the thin-film resistor 40 of the present invention, as shown in FIG. 7. Because the plugs 34 in the two openings 28 can electrically connect the two ends of the resistance layer 24, the plugs 34 and the two conducting layers 36 above the plugs 34 can be used as the electric wires of the two ends of the resistance layer 24. The plugs 35 in the contact holes 50 and the conducting layers 36 above the plugs 35 can be used as electric wires among the components of the semiconductor wafer 21.

As shown in FIG. 7, the thin-film resistor 40 of the present invention comprises the resistance layer 24 positioned within the predetermined area on the surface of the dielectric layer 20, the protective layer 26 with openings 28 positioned in the predetermined area on the resistance layer 24, the insulating layer 30 covering the surface and the side of the protective layer 26, the side of the resistance layer 24 and the surface of the dielectric layer 20 outside the predetermined area, two plugs 34 installed separately in the two openings 28 of the insulating layer 30 and the protective layer 26 and also connecting the two ends of the resistance layer 24, and two conducting layers 36 installed on the two plugs 34 so that the two conducting layers 36 and the plugs 34 can be used as electrical wires to connect the resistance layer 24.

In the thin-film resistor 40 of the present invention, the isolating layer 22 below the resistance layer 24 isolates out-gassing generated from the borophosphosilicate glass of the dielectric layer 20 to prevent the out-gassing from affecting the resistance value of the resistance layer 24. The protective layer 26 protects the underlying resistance layer 24 from plasma damage caused by subsequent dry-etching processes. Also, the two openings 28 of the protecting layer 26 are formed by wet-etching and can prevent plasma damage to the resistance layer 24 from the dry-etching process. So the resistance of the resistance layer 24 of the thin-film resistor 40 of the present invention is very stable.

In the thin-film resistor 40 of the present invention, the side of the resistance layer 24 is covered by the insulating layer 30. Therefore, the metallic conducting layer 36 can connect to other components of the semiconductor wafer 21 without contacting the side of the resistance layer 24. This prevents short circuiting. As a result, there are less restrictions in the design of the electrically connecting wires on the metallic conducting layer 36. Also, other than the two openings of the protective layer 26 being made by wet-etching, all other etching processes are anisotropic dry-etching processes. Therefore, the area of the resistance layer 24 can be very small with only the plugs 34 and the overlying conducting layers 36 serving as electrical connecting wires of the resistance layer 24. The present invention is suitable for processes with line-widths of 0.5 $\mu$m.

Compared to the thin-film resistor 18 of the prior art, in the present invention the thin-film resistor 40 and the method for its formation, the resistance layer 24 is sandwiched between an overlying protective layer 26 and the underlying isolating layer 22. The insulating layer 30 is then deposited onto the surface of the semiconductor wafer 21 thus stabilizing the resistance of the resistance layer 24. Also, the openings 28 in the protective layer 26 are formed by wet-etching but all other etching processes are anisotropic dry-etching processes. Therefore, the area of the resistance layer 24 can be as small as possible. The present invention method not only produces a stable resistance thin-film resistor 40, but also may be used in processing of line-widths of 0.5 $\mu$m to reduce the area of the semiconductor products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a thin-film resistor having stable resistance value on an out-gassing dielectric layer of a semiconductor wafer comprising:

consecutively forming an isolating layer, a resistance layer and a non-conductive protective layer over the dielectric layer so as to form a sandwiched laminate, with the resistance layer interposed between the underlying isolating layer and the overlying protective layer, wherein the isolating layer prevents out-gassing of the underlying dielectric layer from affecting the resistance value of the resistance layer and the protective layer functions to prevent plasma damage during subsequent formation of an opening above the two ends of the resistance layer;

executing a first lithographic and dry-etching process to anisotropically etch away a portion of the isolating layer, the resistance layer and the protective layer, so as to form an island of the sandwiched laminate on the surface of the dielectric layer;

forming an insulating layer covering the surface of the island;

performing a second lithographic and dry-etching process on the insulating layer to dry etch two openings in the insulating layer above the two ends of the resistance layer, so as to expose a portion of the underlying protective layer;

wet-etching the protective layer through the two dry-etched openings of the insulating layer to form two wet-etched contact holes extending down to the resistance layer without affecting the resistance layer;

forming two plugs in the two contact holes for electrically connecting two ends of the resistance layer; and forming two conductive layers on the two plugs as two electric wires for electrically connecting the two ends of the resistance layer.

2. The method of claim 1 wherein the resistance layer is made of CrSi.

3. The method of claim 1 wherein the protective layer is formed of silicon nitride the insulating layer is formed of silicon oxide, and the out-gassing dielectric layer is formed of borophosphosilicate glass (BPSG).

4. The method of claim 1 wherein the isolating layer is formed of silicon nitride or silicon oxide.

5. The method of claim 1 wherein the wet-etching process employs phosphoric acid ($H_3PO_4$) as an etching solution.

6. The method of claim 1 wherein the two plugs are formed of tungsten.

7. The method of claim 1 wherein the two plugs are formed by using the following steps:

forming a titanium layer on the surface of the semiconductor wafer and on the surfaces of the two contact holes;

forming a titanium nitride layer on the titanium layer;

forming a tungsten layer on the titanium nitride layer; and performing an etch back process on the semiconductor wafer to remove the tungsten layer over the insulating layer;

wherein the remaining tungsten layer left in the two contact holes form the two plugs.

8. The method of claim 1 wherein at least one contact hole is formed in the dielectric layer during the second dry-etching process, which is used as a path for electrically connecting to the device of the semiconductor wafer.

* * * * *